United States Patent
Bauch et al.

(10) Patent No.: US 6,737,748 B2
(45) Date of Patent: May 18, 2004

(54) STACKED VIA WITH SPECIALLY DESIGNED LANDING PAD FOR INTEGRATED SEMICONDUCTOR STRUCTURES

(75) Inventors: Lothar Bauch, Dresden (DE); Thomas Zell, Dresden (DE); Matthias Uwe Lehr, Dresden (DE); Albrecht Kieslich, Radebeul (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/082,554

(22) Filed: Feb. 25, 2002

(65) Prior Publication Data

US 2002/0117759 A1 Aug. 29, 2002

Related U.S. Application Data

(63) Continuation of application No. PCT/DE00/02864, filed on Aug. 23, 2000.

(30) Foreign Application Priority Data

Aug. 23, 1999 (DE) .......................................... 199 39 852

(51) Int. Cl.⁷ ............................................... H01L 23/48
(52) U.S. Cl. ........................ 257/763; 257/750; 257/774; 257/773; 257/741; 257/744
(58) Field of Search ................................. 257/250, 763, 257/741, 773, 774, 744, 701, 758, 775, 776, 698

(56) References Cited

U.S. PATENT DOCUMENTS

| 5,591,673 | A | | 1/1997 | Chao et al. |
| 5,894,170 | A | | 4/1999 | Ishikawa |
| 6,072,242 | A | * | 6/2000 | Son ............................ 257/773 |
| 6,277,761 | B1 | * | 8/2001 | Diewald et al. .............. 216/18 |
| 6,353,269 | B1 | * | 3/2002 | Huang ........................ 438/241 |

FOREIGN PATENT DOCUMENTS

DE 198 02 161 A1 7/1999

* cited by examiner

*Primary Examiner*—Nathan J. Flynn
*Assistant Examiner*—Pershelle Greene
(74) *Attorney, Agent, or Firm*—Laurence A. Greenberg; Werner H. Stemer; Ralph E. Locher

(57) ABSTRACT

In the fabrication of stacked vias, metal islands referred to as landing pads are introduced for the purpose of contact-connection between the vias that are arranged one above the other. The metal islands project laterally beyond the vias to a significant extent on account of the line shortening effect. The vias arranged in layers lying one above the other are laterally offset with respect to one another. The landing pad of the invention is configured as an interconnect running between the vias. On account of the line shortening effect, which is less critical for longer tracks, contact areas provided at the ends of the interconnect do not have to be chosen to be as large as the square contact areas of conventional metal islands and can therefore be accommodated to save more space on a circuit layout to be miniaturized. The shrink factor of such a semiconductor structure is increased.

18 Claims, 1 Drawing Sheet

STACKED VIA WITH SPECIALLY DESIGNED LANDING PAD FOR INTEGRATED SEMICONDUCTOR STRUCTURES

CROSS-REFERENCE TO RELATED APPLICATION

This application is a continuation of copending International Application No. PCT/DE00/02864, filed Aug. 23, 2000, which designated the United States.

BACKGROUND OF THE INVENTION

FIELD OF THE INVENTION

The invention lies in the semiconductor technology field. More specifically, the invention relates to an integrated semiconductor structure having at least one contact which extends through a plurality of layers and serves for electrically contact-connecting regions of the semiconductor structure. The contact has a first contact hole filling in a first layer and a second contact hole filling in a second layer and, in an intermediate layer situated between the first and second layers, an intermediate structure for connecting the first contact hole filling to the second contact hole filling.

Such contacts introduced into layer sequences of this type are referred to as a stacked vias. A stacked via serves to electrically connect a regions buried below such structures through the overlying layer sequence. In multilayer metallizations, in particular, the contacts have to be led through the individual metal layers and the insulating oxide layers situated in between. To that end, after the deposition of each plane, a lithographically formed opening (via) is etched free and then filled with a conductive material. In the metal planes situated between the oxide layers, metal islands are produced likewise by lithography. These metal islands referred to as landing pads serve for electrically connecting the via introduced in the underlying oxide layer to the via that is to be introduced above it in the next oxide layer to be deposited.

The contact sequences comprising vias and landing pads fabricated in this way are susceptible, on account of their lithographic mode of fabrication, to incorrect settings primarily during the mask exposure. Principally an incorrect setting of the stepper, a defocusing, an incorrect exposure dose and the distance of outer structures from the optical axis of the mask exposure, the distance having different values depending on the exposure field size, lead to the effect known as line shortening, wherein structural elements are imaged too small and e.g. lines are imaged too short. For this reason, the metal islands for via contact-connection are dimensioned to be larger than is actually necessary, in order that the stacked via nonetheless electrically conducts even in the case of vias not lying exactly one above the other or in the case of a lateral offset or excessively small dimensions of the metal island.

In the design of the course of metallization tracks in the metal plane, a periodic basic grid made of points or lines which are arranged in accordance with the edges or corners of a square is generally taken as a basis. On this basic grid, the metal islands, which are intended to conduct only in the vertical direction perpendicular to the metallization plane, are marked as a square that is as small as possible, in order that it maintains the largest possible distance from adjacent points of the basic grid. In view of the line shortening, however, which is critical in both dimensions in the case of the square metal island, narrow limits are imposed on the possible reduction of the contact size. In practice, landing pads are subsequently enlarged again after the conclusion of the layout design. However, at the latest when the design, once developed, is reduced in size by a certain shrink factor, the limit is rapidly reached at which the minimum distance from adjacent metal tracks which is prescribed by the design rules is undershot or the reliable contact-connection of vias lying one above the other is no longer ensured.

A further disadvantage is that resist structures for the production of conventional landing pads can become detached from the support. As a result of focus fluctuations that increase with the substrate area, resist structures with obliquely inclined side walls are produced. Particularly resist structures with an upwardly increasing cross-sectional area are easily detached from the metallization layer during spinning off and spread over the substrate.

SUMMARY OF THE INVENTION

It is accordingly an object of the invention to provide an integrated semiconductor structure, which overcomes the above-mentioned disadvantages of the heretofore-known devices and methods of this general type and which ensures that electrical contacts extending through a plurality of layers conduct electrically with sufficient security against faults despite increasing miniaturization; this is to be ensured without lateral distances prescribed by design rules being undershot. Furthermore, it is an object of the present invention to provide a semiconductor structure of this type which, on account of its structure, can be fabricated without the above-described postprocessing in the form of subsequent expansion of landing pads. Finally, the intention is that the semiconductor structure to be produced can be fabricated with a lower risk of resist structures chipping off during the spinning off process.

With the foregoing and other objects in view there is provided, in accordance with the invention, an integrated semiconductor structure having a plurality of layers, a contact structure extending through a plurality of layers and serving for electrically contact-connecting regions of the semiconductor structure. The contact structure comprises a first contact hole filling in a first layer, a second contact hole filling in a second layer, and an intermediate structure in an intermediate layer disposed between the first layer and the second layer and connecting the first contact hole filling with the second contact hole filling, the intermediate structure forming an interconnect having a length between longitudinal ends thereof and a given width, and a contact area at each of the longitudinal ends with a contact area width greater than the given width.

In other words, the intermediate structure has an interconnect running in the intermediate layer, and the interconnect is formed with end areas that are wider than the connecting structure in between.

The invention exploits the fact that the line shortening effect is less pronounced in the case of a line than in the case of a small, almost point-like contact area. Therefore, on the basis of the basic grid used, a line rather than a point is selected as the basic pattern for a contact area, so that rather than two points, a point and a line meet at the connection between via and landing pad. According to the invention, the contact hole fillings in the oxide layers, above and below the metallization plane, considered from the plan view, are arranged laterally offset relative to one another. The semiconductor structures provided with the landing pads formed according to the invention are shrinkable to a degree at which conventional square metal contacts are no longer suitable for production. Since the line shortening has a less pronounced effect on the metal island formed as an interconnect, the postprocessing conventionally used after the conclusion of the layout design can be obviated. The invention furthermore has the advantage that a plurality of stacked vias running next to one another can run closely next to one another, namely at a distance of a respective length of the basic grid in each plane, whereas conventional square and subsequently expanded metal contacts, on account of design rule contraventions, had to run at a distance of two basic lengths from one another or from further metallization tracks. As a result, despite the originally point-type contacts being enlarged to form interconnects, there is an increase in the shrink factor of the entire structure.

In accordance with a preferred embodiment of the invention, the interconnect connects two nearest points of a periodic basic grid to one another.

In accordance with an additional feature of the invention, the intermediate structure has a square contact area at each end of the interconnect. Even with differently shaped contact areas at both ends of the interconnect, the result is that the shape of the intermediate structure or metal island has an approximately bone-like appearance.

The metal island is expediently composed of the same conductive material of which the metallization plane is also composed. The vias in the adjacent, preferably oxidic layers preferably predominantly contain tungsten.

A development of the invention which is directed at multilayer metallizations provides for at least one further metallization layer to be adjacent to the first and/or the second layer.

Any semiconductor structures, but preferably DRAMs, in particular embedded DRAMs, are appropriate as integrated semiconductor structures with the stacked vias configured according to the invention.

Other features which are considered as characteristic for the invention are set forth in the appended claims.

Although the invention is illustrated and described herein as embodied in a stacked via with specially designed landing pad for integrated semiconductor structures, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
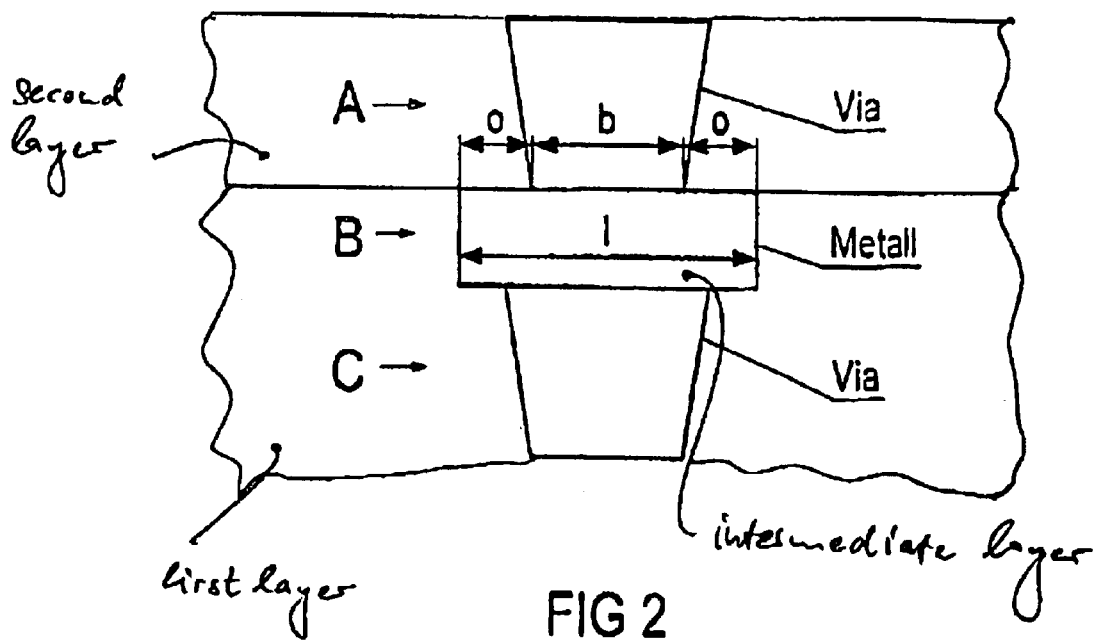
FIG. 1 is a diagrammatic sectional view of a model of a stacked via formed in a prior art process before layout postprocessing.
Figure 2:
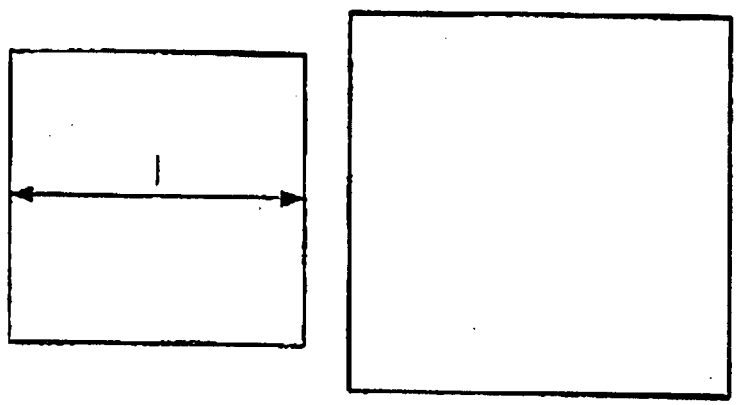
FIG. 2 is a plan view onto the metallization island in the stacked via of FIG. 1 before and after layout postprocessing.

Referring now to the figures of the drawing in detail and first, particularly, to FIG. 1 thereof, there is shown a conventional square landing pad that extends around an edge of width o on all four sides beyond the dimensions b at the bottom of a via. The landing pad which, with a dimension of l=b+2o, maintains sufficient distances from adjacent metallization tracks and therefore conforms to design rules is enlarged in the context of the layout postprocessing in accordance with FIG. 2.

With this size, although the vertically adjacent vias are contact-connected, there is nonetheless the fear of short circuits arising within the metallization plane.

Figure 3:
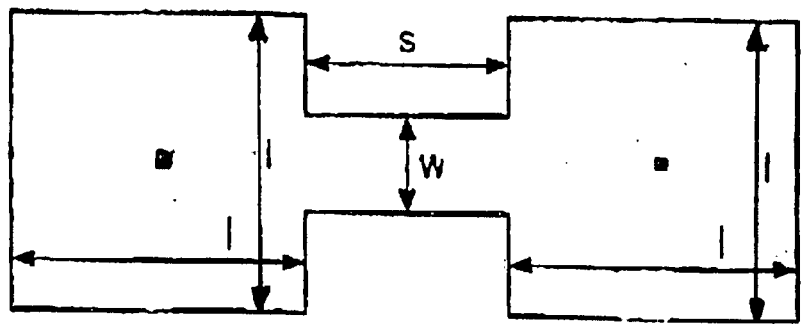
FIG. 3 is a plan view onto a metallization island formed in accordance with the invention.

FIG. 3 shows a landing pad according to the invention in the shape of a bone or a dumbbell (or an H), formed from an interconnect having a width w and a length s+l, strengthened at both ends by square end contacts having the dimension 1. Unlike those in FIG. 2, these squares are no longer enlarged. For this reason, the bone structure illustrated, even though it occupies two points of the basic grid, fits better into the grid layout and, even in the case of subsequent miniaturization of the circuit, carries a more reliable via contact-connection than the expanded square metal island illustrated on the right in FIG. 2.

It goes without saying that it lies within the scope of the present invention for the form of the metal contact according to the invention to be altered, extended, or adapted to an altered basic grid. Thus, by way of example, it is possible for a vertically running interconnect with terminating square contact area to be added to the bone shape illustrated in FIG. 3. In this case, too, the landing pad occupies only two adjacent points of the basic grid in each dimension, whereas a conventionally configured square landing pad enlarged by postprocessing exceeds the minimum distances from the adjacent point of the basic grid in each direction and therefore effectively takes up a basic area of 3 times 3 grid points.

We claim:

1. In a stacked via having a first layer, a second layer, and an intermediate layer, a contact structure extending through the first layer, the second layer, and the intermediate layer for electrically connecting regions of the semiconductor structure, the contact structure comprising:
    a first contact hole filling in the first layer;
    a second contact hole filling in the second layer; and
    an intermediate structure in the intermediate layer disposed between the first layer and the second layer and connecting said first contact hole filling with said second contact hole filling, said intermediate structure forming an interconnect having a length between longitudinal ends thereof, said interconnect having a contact area at each of said longitudinal ends with a contact area width perpendicular to said length, and a connecting structure connecting said contact areas, said connecting structure having a connecting structure area with a connecting structure area width perpendicular to said length, said contact area width being greater than said connecting structure area width.

2. The contact structure according to claim 1, wherein said interconnect is configured to connect two nearest points of a periodic basic grid disposed on said interconnect, to one another.

3. The contact structure according to claim 2, wherein said contact area of said intermediate structure is a square contact area at each end of the interconnect.

4. The contact structure according to claim 3, wherein the contact areas and the interconnect define a bone-shape form of said intermediate structure.

5. The contact structure according to claim 1, wherein said intermediate layer is a metallization plane, and said intermediate structure is formed of a conductive material of the metallization plane.

6. The contact structure according to claim 1, wherein said contact hole fillings contain tungsten.

7. The contact structure according to claim 1, wherein the first and second layers are oxide layers.

8. The contact structure according to claim 1, wherein said first contact hole filling and said second contact hole filling are laterally offset relative to one another.

9. The contact structure according to claim 1, wherein said first contact hole filling and said second contact hole filling are the only contact hole fillings contacting said intermediate structure.

10. In a DRAM having a first layer, a second layer, and an intermediate layer, a contact structure extending through the first layer, the second layer, and the intermediate layer for electrically connecting regions of the DRAM, the contact structure comprising:

a first contact hole filling in the first layer;

a second contact hole filling in the second layer; and an intermediate structure in the intermediate layer disposed between the first layer and the second layer and connecting said first contact hole filling with said second contact hole filling, said intermediate structure forming an interconnect having a length between longitudinal ends thereof, said interconnect having a contact area at each of said longitudinal ends with a contact area width perpendicular to said length, and a connecting structure connecting said contact areas, said connecting structure having a connecting structure area with a connecting structure area width perpendicular to said length, said contact area width being greater than said connecting structure area width.

11. The contact structure according to claim 10, wherein said interconnect is configured to connect two nearest points of a periodic basic grid disposed on said interconnect, to one another.

12. The contact structure according to claim 11, wherein said contact area of said intermediate structure is a square contact area at each end of the interconnect.

13. The contact structure according to claim 12, wherein the contact areas and the interconnect define a bone-shape form of said intermediate structure.

14. The contact structure according to claim 10, wherein said intermediate layer is a metallization plane, and said intermediate structure is formed of a conductive material of the metallization plane.

15. The contact structure according to claim 10, wherein said contact hole fillings contain tungsten.

16. The contact structure according to claim 10, wherein the first and second layers are oxide layers.

17. The contact structure according to claim 10, wherein said first contact hole filling and said second contact hole filling are the only contact hole fillings contacting said intermediate structure.

18. The contact structure according to claim 10, wherein said first contact hole filling and said second contact hole filling are laterally offset relative to one another.

* * * * *